United States Patent [19]

Sandy

[11] 4,321,567

[45] Mar. 23, 1982

[54] COMBINING SERIES SECTIONS WEIGHTING WITH WITHDRAWAL WEIGHTING IN SAW TRANSDUCERS

[75] Inventor: Frank Sandy, Lexington, Mass.

[73] Assignee: Raytheon Company, Lexington, Mass.

[21] Appl. No.: 133,089

[22] Filed: Mar. 24, 1980

[51] Int. Cl.³ .................... H03H 9/64; H03H 9/25; H01L 41/04
[52] U.S. Cl. .................................... 333/196; 333/194
[58] Field of Search ............................ 333/150–155, 333/193–196; 310/313 A, 313 B, 313 C, 313 D, 313 R

[56] References Cited

U.S. PATENT DOCUMENTS

| | | | |
|---|---|---|---|
| 3,931,597 | 1/1976 | Cho et al. | 333/154 |
| 4,006,438 | 2/1977 | Bennett | 333/196 |
| 4,065,789 | 12/1977 | DeVries | 333/194 X |
| 4,143,340 | 3/1979 | Hunsinger | 333/151 |
| 4,146,808 | 3/1979 | Laker et al. | 310/313 B |
| 4,146,851 | 3/1979 | Dempsey et al. | 333/194 |
| 4,223,285 | 9/1980 | Hazama et al. | 333/194 |

FOREIGN PATENT DOCUMENTS 1357193  6/1974 United Kingdom ................ 333/196

OTHER PUBLICATIONS

Hartmann–"Weighting Interdigital Surface Wave Transducers by Selective Withdrawal of Electrodes", 1973 Ultrasonics Symposium Proceenings, IEEE Cat. #73 CHO 807-85U; pp. 423-426.
Hartmann et al.–Impulse model design of Acoustic Surface-Wave Filters", IEEE Trans. on Microwave Theory and Techniques, vol. MTT-21, No. 4, Apr. 1973; pp. 162-167.

Primary Examiner—Marvin L. Nussbaum
Attorney, Agent, or Firm—Vincenzo D. Pitruzzella; Joseph D. Pannone; Milton D. Bartlett

[57] ABSTRACT

A transducer for a SAW device having withdrawal weighting combined with series sections weighting to achieve a desired frequency response. Withdrawal weighting is employed where the impulse response can be adequately approximated by a withdrawal pattern with series sections electrodes being used to provide the additional weighting required. Additionally, electrodes using a different number of series sections are separated by a gap a few wavelengths wide in order to avoid sharp discontinuities.

10 Claims, 4 Drawing Figures

COMBINING SERIES SECTIONS WEIGHTING WITH WITHDRAWAL WEIGHTING IN SAW TRANSDUCERS

BACKGROUND OF THE INVENTION

Surface acoustic wave transversal filters are generally constructed by spatially weighting the transducers with the desired impulse response. Several weighting schemes have been proposed. Some of the more commonly used are apodization and withdrawal weighting. Both have been successful but they each have definite limitations. Using apodization, the overlap of adjacent transducer electrodes, is proportional to the desired weighting at that position in the transducer. This causes the acoustic wave to be nonuniform across the acoustic aperture. As a result, the frequency response of the filter with two apodized transducers is not the product of the separate response functions. As a consequence, although filters utilizing apodization techniques for both input and output transducers produce predictable results, they are difficult to synthesize. Thus, in practice, SAW filters are not designed with two apodized transducers unless a multi-strip coupler is also included to make the acoustic beam uniform across its aperture. A second drawback of apodization is that regions of the transducer with small weights have very short overlaps. The narrow acoustic beam generated by this small overlap often suffers from unacceptable diffraction problems.

Withdrawal weighting solves some of the problems of small electrode overlap and nonuniform acoustic waves by having all of the transducer electrodes the same length. The weighting is obtained by removing electrodes so that the local density of the remaining electrodes is approximately equal to the desired weighting in that region. Even though withdrawal weighting results in a full acoustic aperture, it works by averaging the effects of a group of electrodes over a region and is thus inherently limited by the fact that the desired impulse weighting cannot always be adequately approximated by a withdrawal pattern.

Another technique for producing weighting in a transducer is the series sections weighting. It works by breaking down an individual electrode in several components all connected effectively in series. An electrode pair is fabricated by a specified number of radiators which are electrically coupled to each other in series. Effectively, each electrode pair results in a specified number of capacitors all connected in series that divide the voltage across that electrode and hence the weighting of that electrode pair is the reciprocal of the number of series sections. One problem with series section weighting is that the weights are restricted to reciprocals of integers and, therefore, there is an insufficient control over large weighting values. For very small weights, the number of series sections needed becomes very large and the fraction of aperture taken up by the transition between series sections becomes significant and the corresponding error due to end effects at each transition may become large.

All of the weighting techniques for transducers have disadvantages that result in compromised performance of SAW devices.

SUMMARY OF THE INVENTION

What is needed is a weighting scheme that uses full length electrodes as in withdrawal weighting and nearly continuous variation control over weighting with position as in apodization weighting without the problems associated with each. This can be accomplished by means comprising a substrate for supporting surface acoustic waves, means for providing a predetermined frequency response on the substrate comprising a plurality of electrodes disposed on a surface of the substrate, adjacent ones of the electrodes forming pairs, each of the electrode pairs having one or more series sections, and these electrodes having a spatial distribution substantially proportional to the time-amplitude characteristics of the impulse response corresponding to the frequency response. The impulse response of the transducer is defined as the inverse Fourier transform of the frequency response. A series section is a portion of an electrode pair that is used to reduce the electric field for that electrode pair. Preferably, said electrode pairs form substantially equal apertures.

This invention further provides for means comprising a substrate for supporting surface acoustic waves, means for providing a predetermined frequency response on the substrate comprising a plurality of withdrawal weighted electrodes disposed on a surface of the substrate, and the electrodes forming pairs, each of these pairs comprising one or more sections connected in series. Withdrawal weighting is accomplished by the selective removal of some of the electrodes. Preferably, electrode pairs having a different number of series sections are separated by a distance of at least two wavelengths. Additionally, each of these series electrode pairs comprises not more than twenty series sections.

Further, in accordance with this invention there is provided means comprising a substrate for supporting waves traveling on a surface of the substrate, a plurality of electrodes forming an array disposed on this surface, means for electrically weighting individual electrode pairs of the array, and means for spatially weighting the electrode array. Preferably, the electrical weighting means comprise one or more sections, these sections being connected in series and forming one electrode pair. Preferably, the spatially weighting means comprise spaced apart groups of electrode pairs, each group having electrode pairs of an equal number of sections, and at least one of these groups having a varying spacing between certain ones of these electrode pairs.

Additionally, this invention provides for means comprising a substrate for supporting propagation of surface acoustic waves, a plurality of electrodes disposed in groups on a surface of said substrate, these groups being spaced apart by varying amounts and adjacent electrodes in each group forming electrode pairs, each of these electrode pairs comprising one or more sections, each of the groups having an equal number of sections for all of the electrode pairs within that group, and one or more of said groups having a varying spacing between said electrode pairs.

An advantage of this invention is that a more accurate reproduction of a given response function is achievable by using series section weighting to further adjust the withdrawal weighted array.

Another advantage of the present invention is that for a given accuracy level of the transducer's performance, a greater accuracy can be specified for the array design in order to offset errors in the mass production of the array, and thus allow a wider production tolerance.

BRIEF DESCRIPTION OF THE DRAWINGS

A better understanding of the features of this invention may be obtained from the accompanying detailed description used in conjunction with the drawings in which.

DESCRIPTION OF THE PREFERRED EMBODIMENTS

Figure 1:
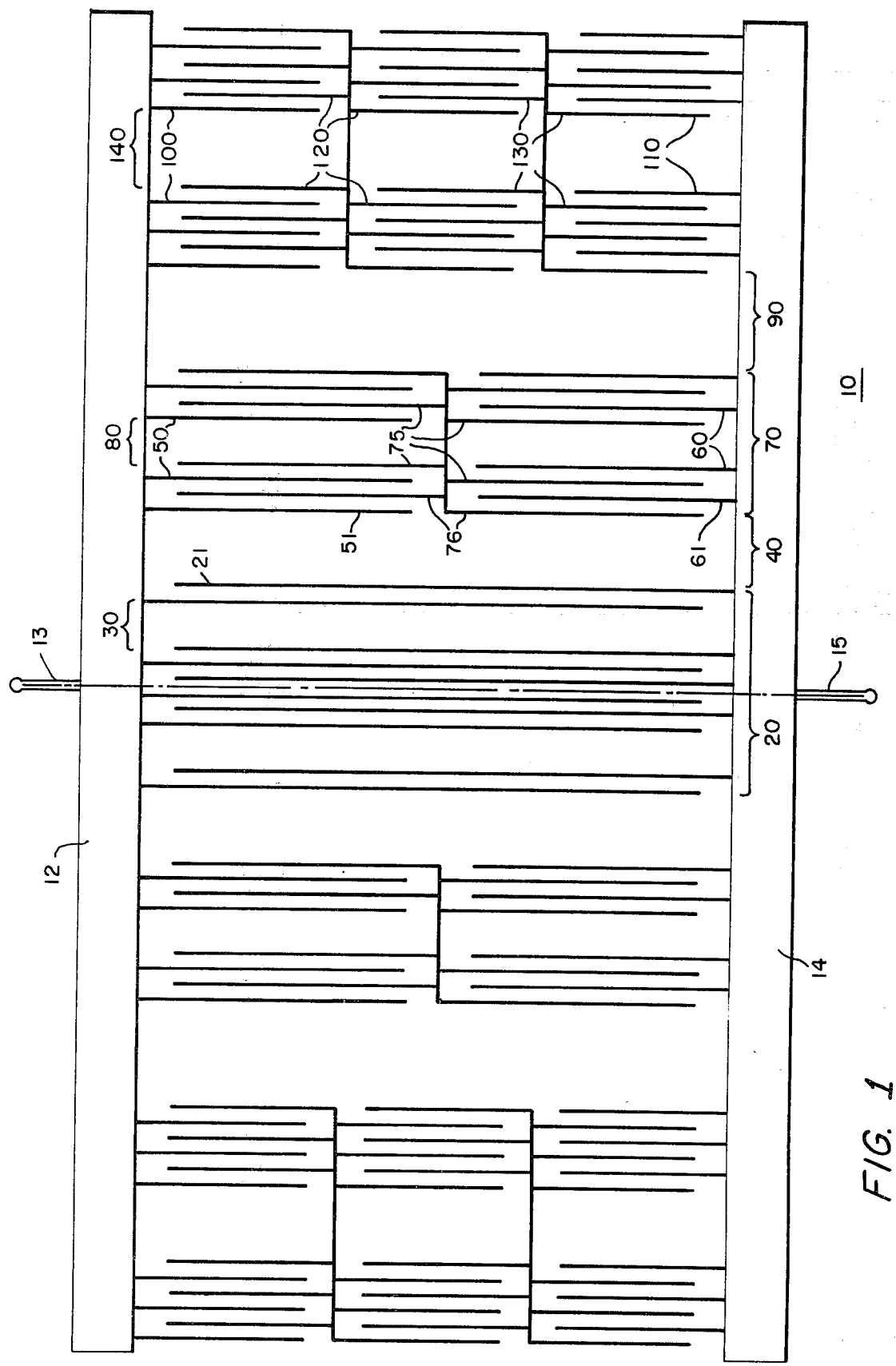
FIG. 1 is an exemplary transducer employing electrodes having withdrawal weighting and series sections weighting, it is shown only to point out the features of a transducer constructed according with the principles of the present invention and not for its frequency response.

Referring now to FIG. 1, there is shown a transducer 10 utilizing the features of the present invention. Two bus bars 12 and 14 are used to feed a voltage to a substrate of piezoelectric material. Conductors 13 and 15 are used to connect the transducer structure to either an input signal or an output structure.

In general, a transducer can be constructed with electrodes having substantially the same aperture and whose relative spacing in any region defines the dominant frequency of the signal in that region. Thus, for a nondispersive array, the spacing between electrodes is uniform and corresponds to one-half the wavelength of the center frequency of that array. To achieve a predetermined frequency response, the transducer employs a weighting of the electrode array which results in a varying contribution of the electrode pairs to the overall response. Withdrawal weighting is a coarse approximation for a predetermined impulse weighting. In particular, if weak local weighting requires leaving only one electrode pair per N electrode pair positions, then the weighting function must not vary substantially over those N electrode pair positions. However, the weighting function of a transducer varies substantially over distances, in wavelengths, comparable to the reciprocal of the fractional bandwidth of its response. Thus, weak weighting can be obtained using withdrawal weighting only in narrow band transducers. Another problem with withdrawal weighting occurs at frequencies far from the center frequency. A single electrode pair along with the region of many adjacent empty electrode positions approximates uniform weak acoustic generation over that local region only if the length of that region, in wavelengths, is less than the reciprocal of the fractional deviation of the frequency from the transducers center frequency. This results in withdrawal weighted transducers having much larger far-out sidelobes than is predicted from the continuous weighting function.

The present invention solves these problems by supplementing withdrawal weighting with series section weighting in order to confine regions having no fingers to a smaller area.

Referring back to FIG. 1, electrodes 20 are spaced one-half of a wavelength apart, the wavelength corresponding to the center frequency of the frequency response of the overall transducer, and the width of each electrode is, equal to one-fourth of the wavelength. Alternatively, to provide for a better frequency and phase response, split electrodes can be used. Each electrode 20 can then be replaced by two electrodes spaced one-eighth of a wavelength apart, each of these narrower electrodes being one-eighth of the wavelength wide. The central set of electrodes 20 is seen spanning the full aperture of transducer 10. This is equivalent to a one series connection weighting. The array of electrodes for transducer 10 is shown as a symmetrical set for ease of description. However, to implement special types of frequency responses, the electrode array could be asymmetrical. The description will proceed for only one side since FIG. 1 shows a symmetrical device. Transducer 10 is seen to have a central set of electrodes 20 formed by several electrode pairs. Each electrode pair in transducer 10 is connected to opposite bus bars 12 and 14 so as to create a surface acoustic wave in response to a voltage or to induce a voltage output in response to a surface acoustic wave. Within this central set of electrodes, there is seen a region 30 where an electrode pair has been removed to achieve a certain frequency response. Adjacent to this central set of withdrawal weighted electrodes there is a region 40 where several electrode pairs have been removed, again in accordance to withdrawal weighting. Adjacent to region 40 there is a set of electrode pairs 70 which is formed by a two series section for additional weighting. This series section weighting helps reduce the width of empty region 40, so that a smoother approximation of the impulse response is possible. Each electrode pair is formed by a main electrode 50 connected to bus bar 12 and main electrode 60 connected to bus bar 14 and by dog-legged intermediate electrode 75. Dog-legged electrode 75 is disposed between main electrodes 50 and 60 in order to provide two equivalent sections each forming a shorter electrode pair. Electrode 75 is not directly connected to bus bars 12 and 14, but is used to couple the two main electrodes 50 and 60 by forming two sections which are electrically in series. This arrangement generates an equivalent full aperture acoustic beam with reduced intensity, since the voltage is now divided between two electrode sections. The intensity can be further reduced by using more than two sections. For a large number of series sections, however, the fraction of aperture taken up by the dog-legged jogs defining the transition between sections becomes too large. As an upper limit, twenty series sections are believed to be the number for adequate performance. Beyond that, the error due to end effects at each section transition becomes too large. Additionally, the jogs defining these transitions that are at the same potential should be connected together, since their connection improves the tolerance to finger damage.

Within two series sections region 70 there is a region 80 which also employs withdrawal weighting to further achieve a given frequency response. In the example of FIG. 1, this region 80 is shown to be one and one-half wavelengths long. Following this region of two series connections electrodes weighting there is a region 90 that again employs electrode withdrawal weighting to achieve the given frequency response. Following this region, there is seen a region of three series connections electrodes used to further refine the frequency response of the transducer. Each electrode pair in this region is formed by an electrode 100 connected to bus bar 12, electrode 110 connected to bus bar 14, and two intermediate electrodes 120 and 130 positioned between electrodes 100 and 110. These two intermediate electrodes serve to extend the electrode pair over the entire aperture and since the electrode pair is effectively divided into three different sections, the voltage across each is one-third of that across a normal electrode pair. Again, the equipotential section defining points of the center electrodes may be connected together. In general, then, a given electrode pair can be made up of N sections which are electrically in series and hence the weighting of the overall pair is 1/N. Another way of analyzing the series-connected electrode pair is to consider each section as a radiator and these radiators are all coupled to each other serially. Within this three-series connections electrode region again there is a region 140 that employs withdrawal weighting to help achieve the overall desired frequency response for the transducer.

An electrode pair using a different number of series connections than an adjacent pair should be employed in a sparse region, that is, a region in which there are no electrode pairs for the distance of a few wavelengths. This should be done to reduce the assymmetries due to nonuniform beams. This can be seen by looking at electrode 21 and adjacent two-sections electrode pair made up by electrodes 51, 61 and center electrode 76. By placing this two sections electrode pair in the position directly adjacent to electrode 21, that is, a half of a wavelength away, we would obtain two separate tracks for the surface acoustic wave. The first track would correspond to the overlap area between electrode 21 and electrode 51. This overlap area extends on the upper half of the full beam aperture. Since electrode 21 is connected to bus bar 14 and electrode 51 is connected directly to bus bar 12, there is a full voltage difference between them and thus electrode 51 would contribute to generate a half-aperture beam at full strength. Center electrode 76 interacts with electrode 21 to generate a lower track beam of half the aperture. Since center electrode 76 is essentially at half the potential between bus bar 14 and bus bar 12, this half-aperture beam generated in the lower track is only half the strength and thus there is an asymmetry in the surface acoustic wave launched by the interaction of electrode 21 with electrodes 51 and 76. By separating electrode pairs of different number of series connections by a region of a few wavelengths in width, the discontinuities or asymmetries, as generated above, are removed. This occurs because electric field over a large gap does not interact effectively with the acoustic wave. Thus, electrode 21 will not interact with electrode 51 to generate a half-aperture beam of significant strength if electrode 21 is more than a few wavelengths away.

The details of the specific design of SAW transducers to synthesize a given frequency response are not described herein, since the techniques for using a single weighting scheme are well known to those skilled in the art. What the transducer of the present invention shows is the combination of withdrawal weighting with series connections weighting to solve problems associated with each. To synthesize a specific lobe of a weighting function, an electrode design using a single series connection is used first, and withdrawal weighting is used until the regions of empty electrode position require a width greater than several wavelengths. The specific width of these regions depend on how accurately withdrawal weighting approximates the impulse response in a region. If an empty region several wavelengths wide does not sufficiently approximate the impulse response, then the electrode design is changed by employing one or more additional series connections in order to reduce its individual contribution to the overall intensity and thus also reduce the amount of withdrawal weighting required and its corresponding empty region width. Additionally, the transition between electrodes using a different number of series connections should take place over a region at least a few wavelengths wide, to avoid discontinuities that produce asymmetries in the acoustic beams. In general, the desired average signal intensity in any region is determined by the local placement density of electrode pairs in the region divided by the number of series sections forming the electrode pairs in that region.

Figure 2:
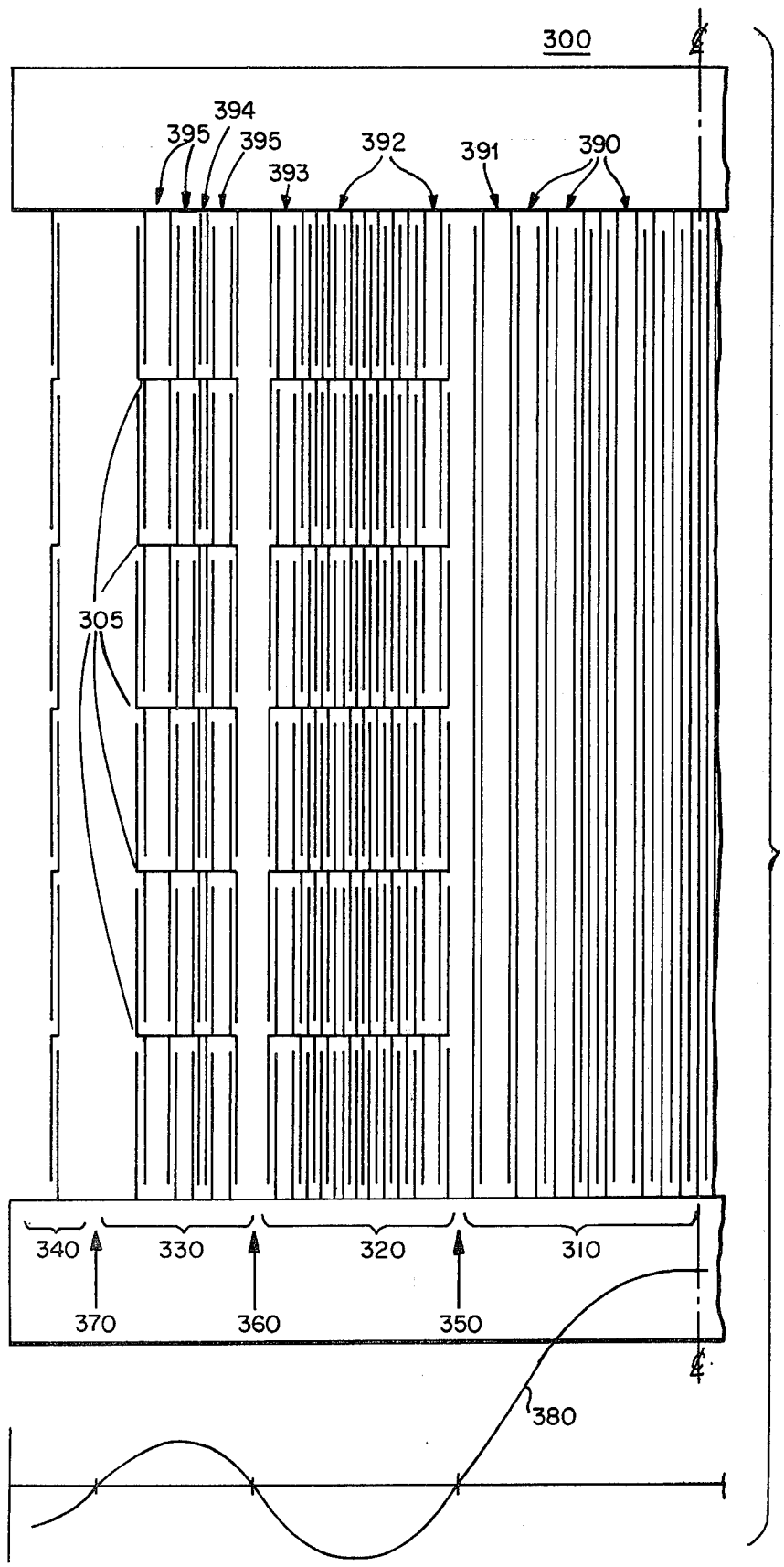
FIG. 2 shows one half of a symmetrical transducer for a filter built using the principles of the present invention to achieve a given frequency response characteristic and its corresponding weighting function.
Figure 3:
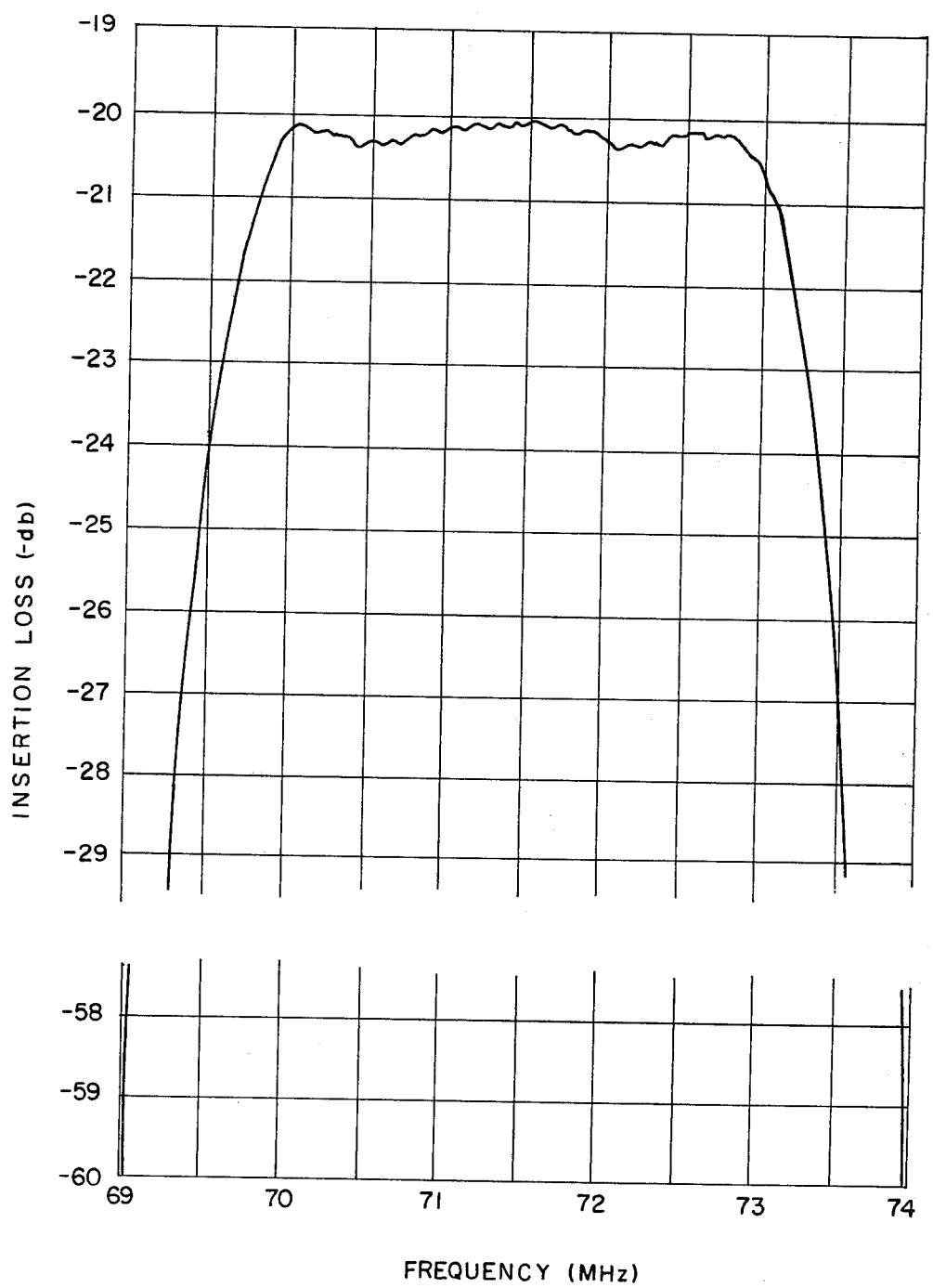
FIG. 3 shows the frequency response achieved with the transducer for FIG. 2.

FIG. 2 shows a transducer 300, not to scale, for a bandpass filter utilizing the methods of the present invention. The filter was constructed to have a center frequency near 70 megahertz with about a five percent bandwidth, a flat passband, and moderately steep skirts. The window function used for each of the two identical transducers for the filter is a Taylor function and is used to smoothly truncate the desired $\sin(\theta)/\theta$ impulse response function. The weighting function is expressed as $W(\theta) = T(3.5 \times \theta) \sin(\theta)/\theta$ where $\theta = X/16$ and X is the position in the transducer in wavelengths from the center. The window function limits the weighting function to a central lobe and two and one-half sidelobes on each side. This weighting function was chosen because it would yield a passband flat to better than 0.1 db if a transducer perfectly reproduced it. FIG. 3 shows the frequency response of transducer 300. Only the passband region is shown since no significant sidelobes occur higher than 40 dB below the passband level. The central lobe 310 of transducer 300 was designed with withdrawal weighting of one series section electrodes while the sidelobes 130, 330 and 340 were designed with withdrawal weighting of six series sections electrode pairs. The pattern had 450 electrode positions. The withdrawal procedure reduced this to 222 electrodes. Using split electrodes also eliminates mechanical triple-transit reflections. Transducer 300 of FIG. 2 does not show split electrodes to improve clarity. Also, to improve clarity, only one-half of one transducer is shown, since the other half is a mirror image of the half shown. One series section region 310 employs withdrawal weighting in the form of one missing electrode at locations 390. Additionally, three missing electrodes at location 391 and several missing electrodes at transition region 350, four for instance, are used to adequately synthesize the central lobe of function 380. Six series sections region 320 also employs withdrawal weighting to synthesize the first side lobe of function 380. Six series sections are employed since the desired response in this region is much lower than at the center region 310, and employing one series section electrode pairs would necessitate removing a much larger number of electrode pairs resulting in an inadequate approximation of response function 380 in region 320. Thus, using six series sections electrodes requires the removal of only one set of electrodes at positions 392 and three sets at position 393. A few more electrodes, eight for instance, than in transition region 350 are removed in transition 360 to more accurately approximate response function 380. Region 330 employs the withdrawal of a few more electrodes since the amplitude of response function 380 is lower in this region. One electrode is withdrawn at position 394 and three electrodes are withdrawn at positions 395. A larger group of electrodes is removed in transition region 370 to correspond with the drop in signal amplitude on response curve 380. The last half lobe of the response curve is generated by a single six series connection electrode pair. If only withdrawal weighting were used, this region would have required one-sixth of a finger pair, and thus would not be physically possible. This response function, or others with similar size weights and bandwidths, then could not be accurately realized with withdrawal weighting alone.

The transducer of the present invention, by combining withdrawal weighting of electrodes with series sections weighting of individual electrode pairs, can reproduce any desired response function more accurately than has been previously possible. This results in an additional advantage in cases where an electrode array has to be mass produced. The greater accuracy achievable by an array of the present invention, allows a greater margin of error in the production process and still achieves a satisfactory reproduction of the response function. For a given accuracy of performance, this invention allows wider manufacturing tolerances than prior transducer designs. By starting with a better electrode array design, a good performance level can be achieved even with some errors introduced by the manufacturing process.

FIG. 2 also shows a plot 380 of the left side of a plot of sin $\theta/\theta$, the weighting function, in spatial relation to the left side of the transducer 300. Arrows 350, 360 and 370 show the points on transducer 300 corresponding to the zero-crossing points of curve 380. A phase change of 180 degrees takes place at these points to implement the correct polarity of the corresponding sidelobes. This is achieved by reversing electrode connections. The points 305 on the intermediate floating electrode that define the transition between each section and that are at the same potential should be connected together. In FIG. 2, these section defining points are shown connected only within each sidelobe producing region 320 and 330. Since the filter requirements were met with equal six series sections in all three sidelobe producing regions 320, 330 and 340, these section defining points may be connected all together.

Figure 4:
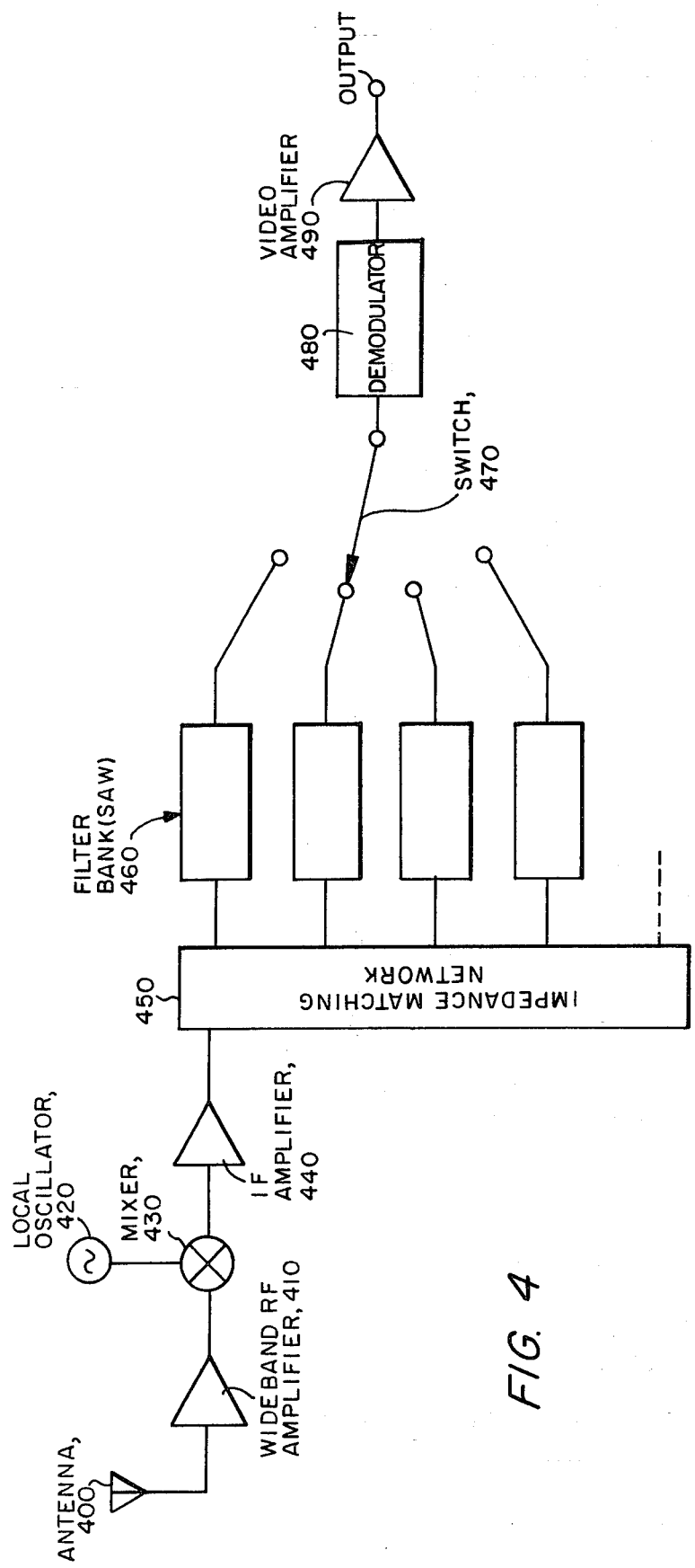
FIG. 4 shows a filter using the transducer of the present invention is a channelized receiver system.

Turning now to FIG. 4, there is shown a system application for a filter designed with principles of the present invention, for instance, the passband filter whose transducers are as depicted in FIG. 2. FIG. 4 shows a channelized receiver. The signals are received by antenna 400 and are then passed through a wide band IF amplifier 410. The output of IF amplifier 410 is then mixed by mixer 430 with a local oscillator signal from local oscillator 420. The heterodyned signal is then amplified by IF amplifier 440 whose output is directed to an impedance matching network 450. The outputs of impedance matching network 450 are then directed to a filter bank 460. Each of the required communication channels has a corresponding passband filter. The desired characteristics of each filter are a flat passband and steep skirts to allow for good channel separation. Each filter can be designed to have similar characteristics and have a center frequency offset from an adjacent one by an appropriate amount. Using the filter of FIG. 2, it can be seen that a passband having a ripple of less than 0.3 db can be achieved as well as having steep skirts and no significant sidelobes higher than 40 db below the passband level. Impedance matching network 450 can be designed to efficiently couple energy to the SAW filters of bank 460 in order to reduce their insertion loss due to mismatching. The outputs of filter bank 460 are then connected to a switch 470. Switch 470, which can be implemented by an electronic switch, is used to select one of the filters corresponding to the desired channel. The output of switch 470, which carries the signal for the desired channel, is connected to the demodulator 480. The output of the demodulator 480 is then amplified by video amplifier 490 and its output signal is the signal output of the selected channel.

The transducer of the present invention is particularly well suited to implementing the requirements of a bank of filters, such as filter bank 460, since a more accurate synthesis of the required passband is possible than with conventional techniques.

It is understood that the above-described embodiments of the invention are illustrative only and that modifications thereof may occur to those skilled in the art without departing from the spirit and scope of the invention. Accordingly, it is desired that this invention be not limited to the embodiments disclosed herein but be limited only as defined by the appended claims.

What is claimed is:

1. In combination:
   means comprising a substrate for supporting surface acoustic waves;
   means for providing a predetermined frequency response on said substrate comprising a plurality of equal width electrodes disposed on a surface of said substrate and arranged in pairs of opposite electrical polarity;
   different ones of said electrode pairs having different predetermined electrical weights;
   said electrodes having a non-uniform spatial distribution substantially proportional to the time-amplitude characteristics of the impulse response corresponding to said frequency response; and
   said electrode pairs have substantially uniform aperture.

2. In combination:
   means comprising a substrate for supporting surface acoustic waves;
   means for providing a predetermined frequency response on said substrate comprising a plurality of withdrawal weighted electrodes disposed on a surface of said substrate;
   said electrodes forming pairs, the two electrodes of each pair having opposite electrical polarity; and
   a plurality of said pairs further comprising sets of pairs having a different predetermined number N of electrically floating electrode components positioned between said two opposite polarity electrodes.

3. The combination of claim 2 wherein:
   said two opposite polarity electrodes and said N electrode sections form N+1 electrode sections electrically coupled in series.

4. The combination of claim 3 wherein:
   each of said series electrode pairs comprises not more than twenty series sections.

5. The combination of claim 4 wherein:
   electrode pairs having a different number of said series sections are separated by a distance of at least two wavelengths.

6. In combination:
   means comprising a substrate for supporting waves traveling on a surface of said substrate;
   a transducer having first and second terminals comprising a plurality of equal width electrodes disposed on said surface and selectively coupled to either said first or second terminal, adjacent ones of said electrodes coupled to a different terminal forming electrode pairs;

means for electrically weighting predetermined ones of said electrode pairs in a non-uniform pattern;

means for spatially weighting said electrode array; and said electrical weighting means comprise at least one intermediate electrode section positioned between the two electrodes forming said pairs, said intermediate section maintaining substantially uniform aperture while reducing the electrical contribution of said electrode pairs.

7. The combination of claim 6 wherein:

said spatially weighting means comprise a predetermined non-uniform spatial distribution of said electrode pairs.

8. In combination:

means comprising a substrate for supporting propagation of surface acoustic waves;

a two terminal electrode array comprising a plurality of electrode pairs disposed on a surface of said substrate, each of said pairs comprising a first and second electrode coupled to opposite terminals of said array, said electrode pairs being disposed in groups with different predetermined spacings between groups;

each of said electrode pairs in a predetermined number of said groups further comprising a predetermined number of intermediate electrode components forming series coupled electrode sections; and at least one of said groups having a varying spacing between said electrode pairs.

9. The combination of claim 8 wherein:

the maximum number of sections forming each of said electrode pairs is twenty.

10. The combination of claim 9 wherein:

each of said groups have an equal number of sections for all electrode pairs within said group.

* * * * *